US007069859B2

(12) United States Patent
Usui

(10) Patent No.: US 7,069,859 B2
(45) Date of Patent: Jul. 4, 2006

(54) PLANOGRAPHIC PRINTING PLATE PACKAGING STRUCTURE AND METHOD FOR PACKAGING PLANOGRAPHIC PRINTING PLATE

(75) Inventor: Takayuki Usui, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 144 days.

(21) Appl. No.: 09/906,831

(22) Filed: Jul. 18, 2001

(65) Prior Publication Data

US 2002/0011171 A1 Jan. 31, 2002

(30) Foreign Application Priority Data

Jul. 18, 2000 (JP) ............................ 2000-217053

(51) Int. Cl.
*B65D 77/26* (2006.01)
*G03F 7/004* (2006.01)

(52) U.S. Cl. ...................... 101/494; 101/477; 206/455; 53/446; 53/475

(58) Field of Classification Search ................ 101/477, 101/494; 206/455 O; 53/446 X, 475 X, 53/544, 284.4; 430/302
See application file for complete search history.

(56) References Cited

U.S. PATENT DOCUMENTS 4,171,742 A * 10/1979 Kohayakawa et al. ...... 206/449
4,402,592 A * 9/1983 Schon et al. ................ 399/166
4,806,450 A * 2/1989 Hofmann et al. ........ 430/281.1
4,985,339 A * 1/1991 Koizumi et al. ......... 430/270.1
5,340,699 A * 8/1994 Haley et al. ................ 430/302
5,367,360 A * 11/1994 McIlwraith et al. .......... 355/85
5,563,023 A * 10/1996 Kangas et al. ........... 430/273.1
5,916,734 A * 6/1999 Takagami et al. ........... 430/302
6,423,462 B1 * 7/2002 Kunita ....................... 430/156
6,489,078 B1 * 12/2002 Van Damme et al. ...... 430/170
2003/0017035 A1 * 1/2003 Solomon et al. ....... 414/416.07

FOREIGN PATENT DOCUMENTS

EP 0 955 564 A2 11/1999
EP 1 061 019 A2 * 12/2000
GB 366387 A 2/1932
JP 54-12996 1/1979
JP 64-45273 2/1989
JP 1-99976 4/1989
JP 4-266052 9/1992
JP 8-3898 1/1996
JP 8-39958 2/1996
JP 10-16946 1/1998
JP 2000-95271 * 4/2000

OTHER PUBLICATIONS

European Search Report for Application 01117306.9 2308.

* cited by examiner

*Primary Examiner*—Leslie J. Evanisko
(74) *Attorney, Agent, or Firm*—Sughrue Mion, PLLC

(57) ABSTRACT

A stack of planographic printing plates is accommodated in a packaging box for planographic printing plates in a manner such that imaging surfaces of the planographic printing plates are directed toward a bottom face plate. Therefore, when the packaging box for planographic printing plates is opened in a manner such that top face plates are directed upwards, the imaging surfaces of the planographic printing plates are directed downwards.

21 Claims, 10 Drawing Sheets

P R I O R A R T

PLANOGRAPHIC PRINTING PLATE PACKAGING STRUCTURE AND METHOD FOR PACKAGING PLANOGRAPHIC PRINTING PLATE

BACKGROUND OF THE INVENTION

1. Field of the Invention

The present invention relates to a planographic printing plate packaging structure for accommodating and packaging planographic printing plates which have one surface formed as an imaging surface in a packaging box which includes a portion for taking out printing plates and the like accommodated therein, and to a method for packaging planographic printing plates.

2. Description of the Related Art

In plate making methods of recent years (including electrophotographic plate making methods), planographic printing plates such as photosensitive printing plates or heat sensitive printing plates are widely used in order to facilitate automation of a plate making process. A planographic printing plate is produced by performing surface treatments such as graining, anodic oxidation, silicate treatment, or other chemical conversion treatment solely or in combination as necessary on a substrate which is typically a sheet-shaped or coil-shaped aluminum plate, and then coating a photosensitive layer or a heat sensitive layer (these are referred to as "coating film") thereon, drying, and then cutting to a desired size. This planographic printing plate is subjected to a plate making process including exposure, development, gum coating and the like, then set in a printing machine, coated with ink, thus, texts, images and the like are printed on pieces of paper.

When this planographic printing paper is handled, in order to reduce a frequency of handling so as to perform transportation and storage of the planographic printing paper at low costs, a large number of planographic printing plates may be stacked in a thickness direction to form a stack of planographic printing plates and the stack is then accommodated and packaged in a packaging box.

In FIG. 9, an example of the planographic printing plate packaging structure in which a stack of planographic printing plates is accommodated and packaged in a packaging box 410, is illustrated (see Japanese Patent Application Laid-Open (JP-A) No. 2000-95271).

In this packaging box 410, after a base pad 414 is attached to a base plate 412, side plates 416 and apical plates 418 provided from and in connection with a periphery of the base plate 412 are folded so as to wind around core materials 420. A frame 422, as well as a receiving space 424 formed inside the frame 422, is thus formed. Moreover, a base rug pad 426 is further attached to a base pad 414, and a photosensitive material 428 is received in the receiving space 424. Thereafter, a roof pad 430 which has been attached to a roof plate 432 is fitted into an inner side of the frame 422 and the roof plate 432 is fixed to the box body with an adhesive tape or the like.

Depending on an apparatus in which a planographic printing plate is used, a planographic printing plate whose one side surface is formed as an imaging surface may be set in an apparatus in a state in which the imaging surface thereof is directed downwardly.

However, in the above-described conventional planographic printing plate packaging structure in which the packaging box 410 and the like are used, planographic printing plates are accommodated in the packaging box 410 in a manner such that the imaging surfaces of the planographic printing plates face the roof plate 432 (the imaging surfaces of the planographic printing plates are directed upwardly in FIG. 9). Therefore, it is necessary for a user to turn the planographic printing plates over after opening the packaging box 410 to set the planographic printing plates in an apparatus, and this has become a large operational burden.

Further, the planographic printing plate generally has a thin plate form (for example, a thickness of approximately 0.1–0.5 mm). Because of that, there has been a case in which the planographic printing plate receives external force locally during a reverse operation and is thereby deformed.

Furthermore, even in a case in which the planographic printing plate was not deformed, there has been a case in which a coating film was peeled off from a substrate by external force.

In order to prevent the planographic printing plate from such deformation and to prevent the coating film of the planographic printing plate from peeling off, it has been necessary for a user to perform operations such as reversing the planographic printing plate and loading the planographic printing plate on an apparatus with extreme care, and this has further increased the operational burden on the user.

SUMMARY OF THE INVENTION

In view of the facts described above, an object of the present invention is to provide a planographic printing plate packaging structure in which it is possible to set a planographic printing plate in an apparatus with little operational burden on a user, while the planographic printing plate is prevented from being deformed and the coating film of the planographic printing plate is prevented from peeling off.

A planographic printing plate packaging structure of a first aspect of the present invention is a planographic printing plate packaging structure for accommodating and packaging in a packaging box, planographic printing plates having one surface as an imaging surface, said packaging box including a entrance for taking out printing plates accommodated therein, wherein the planographic printing plates are accommodated and packaged in the packaging box in a manner such that the imaging surfaces of the planographic printing plates are directed to a side opposing the entrance.

Generally, when a packaging box is opened, the packaging box is opened directing an output port thereof upwardly. Since planographic printing plates are accommodated in the packaging box in a manner such that imaging surfaces of the planographic printing plates are directed to a side opposing the entrance, the imaging surfaces are directed downwards when the planographic printing plates are taken out. Therefore, in a case in which the planographic printing plates are set in an apparatus in a state in which the imaging surfaces thereof are directed downwards, there is no need for reversing the planographic printing plates, and this reduces the operational burden on a user. Further, deformation of the planographic printing plates and film peeling which are caused by the reversing operation do not occur.

In the first aspect of the planographic printing plate packaging structure of the present invention, it is preferable for the imaging surfaces of the planographic printing plates to be formed by a recording layer whose solubility in a developer changes when the recording layer is irradiated with a laser beam.

Generally, in the planographic printing plate with the imaging surface formed by such recording layer, the coating film is easily peeled off and damaged. However, the present invention can reliably prevent the film peeling.

Further, in the planographic printing plate with such recording layer, it is possible for images to be formed directly on the imaging surface of the planographic printing plate by irradiating a laser beam thereon.

A second aspect of a method for packaging planographic printing plates of the present invention is a method for packaging planographic printing plates comprises a step of accommodating and packaging planographic printing plates having one surface as an imaging surface in a packaging box which includes a entrance for taking out printing plates accommodated therein, wherein the planographic printing plates are accommodated and packaged in the packaging box in a manner such that the imaging surfaces of the planographic printing plates are directed to a side opposing the entrance.

The present invention is a planographic printing plate packaging structure for accommodating and packaging planographic printing plates having one surface formed as an imaging surface in a packaging box which includes a entrance which is for taking out printing plates and the like accommodated therein, wherein the planographic printing plates are accommodated and packaged in the packaging box in a manner such that the imaging surfaces of the planographic printing plates are directed to the side opposing the entrance. Therefore, in a case in which the planographic printing plates are set in an apparatus in a state in which the imaging surfaces thereof are directed downwards, there is no need for reversing the planographic printing plates, and this reduces the operational burden on the user. In addition, deformation of the planographic printing plates and film peeling which are caused by the reversing operation do not occur.

DESCRIPTION OF THE PREFERRED EMBODIMENTS

Figure 1:
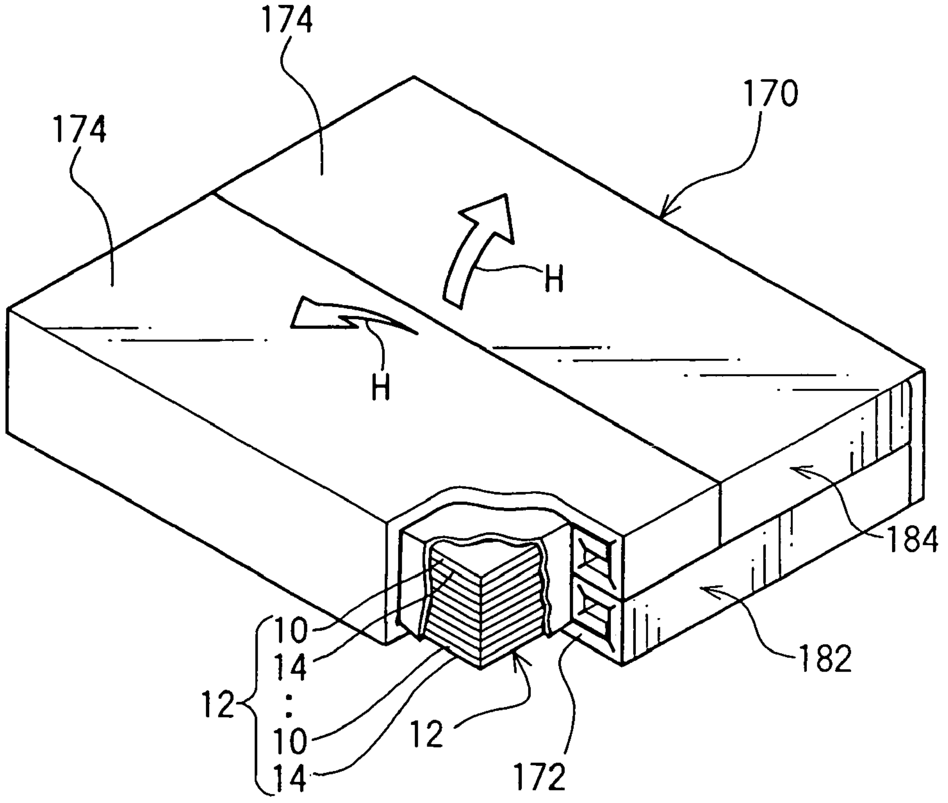
FIG. 1 is a partially broken perspective view which illustrates a state in which a stack of planographic printing plates are accommodated and packaged in a planographic printing plate packaging box relating to a planographic printing plate packaging structure of an embodiment of the present invention.

In FIG. 1, a state (of a planographic printing plate packaging structure), in which a stack 12 of planographic printing plates 10 are accommodated and packaged in a planographic printing plate packaging box 170 relating to an embodiment of the present invention, is illustrated. Also, in FIG. 2, the packaging box 170 for planographic printing plates is illustrated with an unfolded view.

Figure 3:
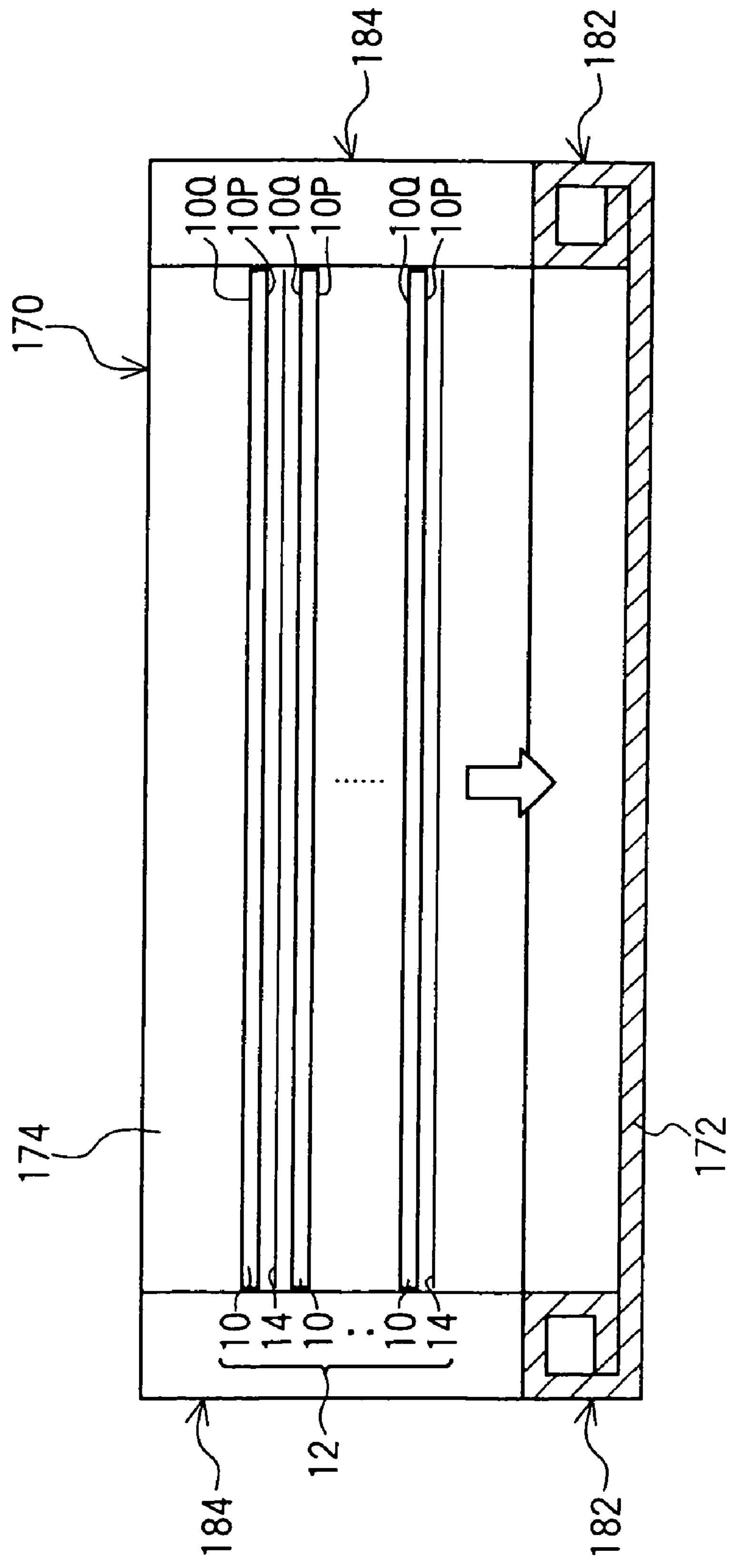
FIG. 3 is a cross-sectional view which illustrates the planographic printing plate packaging structure of an embodiment of the present invention in a state in which the packaging box for the planographic printing plates are opened and the planographic printing plates forming the stack are separated from each other.

The planographic printing plate 10 is formed by applying a coating film (a photosensitive layer for a photosensitive printing plate, a heat sensitive layer for a heat sensitive printing plate) onto one surface of a thin aluminum substrate which is in a form of a rectangular plate. This coating film is subjected to a plate making process including exposure, developing treatment, gum coating and the like, set into a printing machine, and coated with ink to print text, image or the like onto a paper surface. Hereinafter, as illustrated in FIG. 3, the substrate surface onto which the coating film is applied is referred to as an imaging surface 10P, and a surface opposing the imaging surface 10P, i.e., a surface on which the coating film is not applied, is referred to as an non-imaging surface 10Q. It should be noted that the planographic printing plates 10 of the present embodiment are ones at a step before being subjected to processings necessary for printing (such as exposure, development and the like), and may be referred to planographic printing plate precursors or planographic printing plate materials in some cases.

A specific structure of the planographic printing plate 10 is not particularly limited as long as it has the above-described structure. However, for example, by making it a planographic printing plate for heat-mode type and photon type laser printing, it can be made a planographic printing plate which allows direct plate making from digital data.

Further, by selecting components in a photosensitive layer or a heat sensitive layer, various types of planographic printing plates 10 can be made corresponding to various plate making methods. Examples of specific aspects of the planographic printing plate of the present invention include aspects (1) to (11) below:

(1) An aspect wherein the photosensitive layer contains an infrared ray absorbent, a compound which generates an acid when heated, and a compound which is cross-linked by acids.

(2) An aspect wherein the photosensitive layer contains an infrared ray absorbent, and a compound which becomes soluble in an alkali when heated.

(3) An aspect wherein the photosensitive layer includes two layers: a layer containing a compound which generates a radical when irradiated with a laser beam, a binder which is soluble in an alkali, and a polyfunctional monomer or prepolymer; and an oxygen-blocking layer.

(4) An aspect wherein the photosensitive layer is formed of two layers: a physical development nucleus layer and a silver halide emulsion layer.

(5) An aspect wherein the photosensitive layer includes three layers: a polymer layer containing a polyfunctional monomer and a multifunctional binder, a layer containing silver halide and a reducing agent, and an oxygen-blocking layer.

(6) An aspect wherein the photosensitive layer includes two layers: a layer containing novolak resin and naphthoquinonediazide, and a layer containing silver halide.

(7) An aspect wherein the photosensitive layer contains an organic photoconductive material.

(8) An aspect wherein the photosensitive layer includes two to three layers including a laser beam absorbing layer which is removed by laser beam exposure and a lipophilic layer and/or hydrophilic layer.

(9) An aspect wherein the photosensitive layer contains a compound which absorbs energy and generates oxygen; a high molecular compound having in its side chain a functional group which generates sulfonic acid or carboxylic acid by acids; and a compound which absorbs visible light to provide energy to an acid generator.

(10) An aspect wherein the photosensitive layer contains a quinonediazide compound and novolak resin.

(11) An aspect wherein the photosensitive layer contains a compound which decomposes by light or ultraviolet ray and forms a bridging structure with itself or with other molecules in the layer; and a binder which is soluble in an alkali.

In particular, in a planographic printing plate having a photosensitive layer (or a heat sensitive layer) whose solubility in a developer changes when a laser beam is irradiated thereon, the photosensitive layer (or the heat sensitive layer) can easily be damaged. By applying the planographic printing plate packaging structure of the present invention, prevention of so-called film peeling is ensured as will be described later, and this is preferable.

Further, wavelengths of the laser beam mentioned herein are not particularly limited, and examples thereof include:

I. a laser having a wavelength range of 350 to 450 nm (specific examples thereof include a laser diode having a wavelength of 405±5 nm);

II. a laser having a wavelength range of 480 to 540 nm (specific examples thereof include an argon laser having a wavelength of 488 nm, a (FD) YAG laser having a wavelength of 532 nm, a solid-state laser having a wavelength of 532 nm, and a (green) He—Ne laser having a wavelength of 532 nm);

III. a laser having a wavelength range of 630 to 680 nm (specific examples thereof include a He—Ne laser having a wavelength of 630 to 670 nm, a red semiconductor laser having a wavelength of 630 to 670 nm);

IV. a laser having a wavelength range of 800 to 830 nm (specific examples thereof include an infrared ray (a semiconductor) laser having a wavelength of 830 nm); and V. a laser having a wavelength of 1064 to 1080 nm (specific examples thereof include a YAG laser having a wavelength of 1064 nm).

Among the lasers having the wavelengths described above, for example, laser beams with the wavelengths described in II and III are both applicable to either of the planographic printing plates having the photosensitive layer or the heat sensitive layer in the above-described aspects (3) or (4). Also, laser beams with the wavelengths described in IV and V are both applicable to either of the planographic printing plates having the photosensitive layer or the heat sensitive layer in the above-described aspects (1) or (2). It is a matter of course that relationships between wavelengths of laser beams and the photosensitive layers or the heat sensitive layers which can be used are not limited to those described above.

The configuration or the like of the planographic printing plate 10 is not particularly limited, and the planographic printing plate 10 is formed, for example, by coating a photosensitive layer or a heat sensitive layer onto one surface of an aluminum plate which has a thickness of 0.1 to 0.5 mm, long edges (width) of 300 to 2050 mm, and short edges (length) of 200 to 1500 mm.

Figure 10:
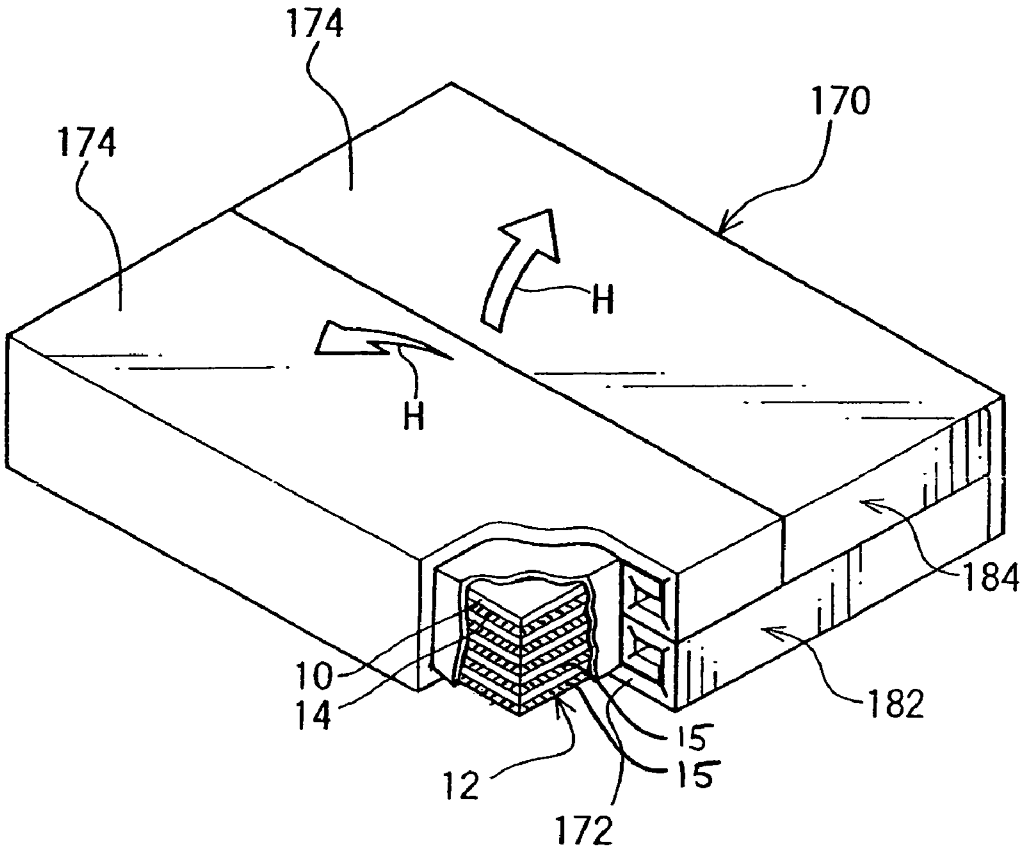
FIG. 10 is a partially broken perspective view which illustrates a state in which a stack of planographic printing plates, interleaved with interleaf sheets and sheets of cardboard, are accommodated and packaged in a planographic printing plate packaging box relating to a planographic printing plate packaging structure of an embodiment of the present invention.

Then, a stack 12 of planographic printing plates 10 is formed by alternately stacking the planographic printing plate 10 and an interleaf sheet 14 which protects the coating film of the planographic printing plate 10 in a thickness direction. Further, the stack 12 may be internally packaged with an inner packaging paper (not illustrated) which has light-blocking property and moisture-proofing property. By internally packaging the stack 12 with an inner packaging paper, the stack 12 can be reliably blocked from light and kept free from moisture and deterioration of the coating films can be prevented. As shown in FIG. 10, pieces of cardboard 15, which are for protection, may be disposed at every predetermined number of the planographic printing plates 10 or at stacking direction end surfaces of the stack 12 to protect the planographic printing plates from external force so as not to allow defects or deformations to arise.

The number of the planographic printing plates 10 forming a single stack 12 is not particularly limited, however, it may be for example, 10 to 200 pieces in view of efficiency in transportation or storage, or the like. Further, it is possible to form the stack 12 with more planographic printing plates 10 in order to enable more efficient transportation or storage (with less handling frequency).

In addition, as long as the interleaf sheets 14 can reliably protect the coating films of the planographic printing plates 10, the specific composition of the interleaf sheets 14 is not limited. For example, 100% wood pulp paper, paper which is not totally made of wood pulp but made of synthetic pulp, paper of these types provided with a low density polyethylene layer, and the like can be used as the interleaf sheets 14. Particularly, since material costs for paper without synthetic pulp is low, the interleaf sheets 14 can be produced at low cost by using the paper without synthetic pulp. More specifically, interleaf sheets produced from bleached Kraft pulp, having basic weight of 20 to 55 $g/m^2$, density of 0.7 to 0.85 $g/cm^3$, moisture of 4 to 6%, Bekk smoothness of 10 to 800 seconds, and pH of 4 to 6 are included. However, of course, the interleaf sheets are not limited to these examples.

Also, as long as the protection cardboard can reliably protect the planographic printing plates, specific composition of the protection cardboard is not limited. For example, protection cardboard produced from pieces of waste paper, having basic weight of 200 to 1500 $g/m^2$, density of 0.7 to 0.85 $g/cm^3$, moisture of 4 to 8%, Bekk smoothness of 3 to 20 seconds, and pH of 4 to 6, is included. It should be noted that the protection cardboard and the interleaf sheets 14 may be omitted depending on a type of the planographic printing plates 10.

Figure 2:
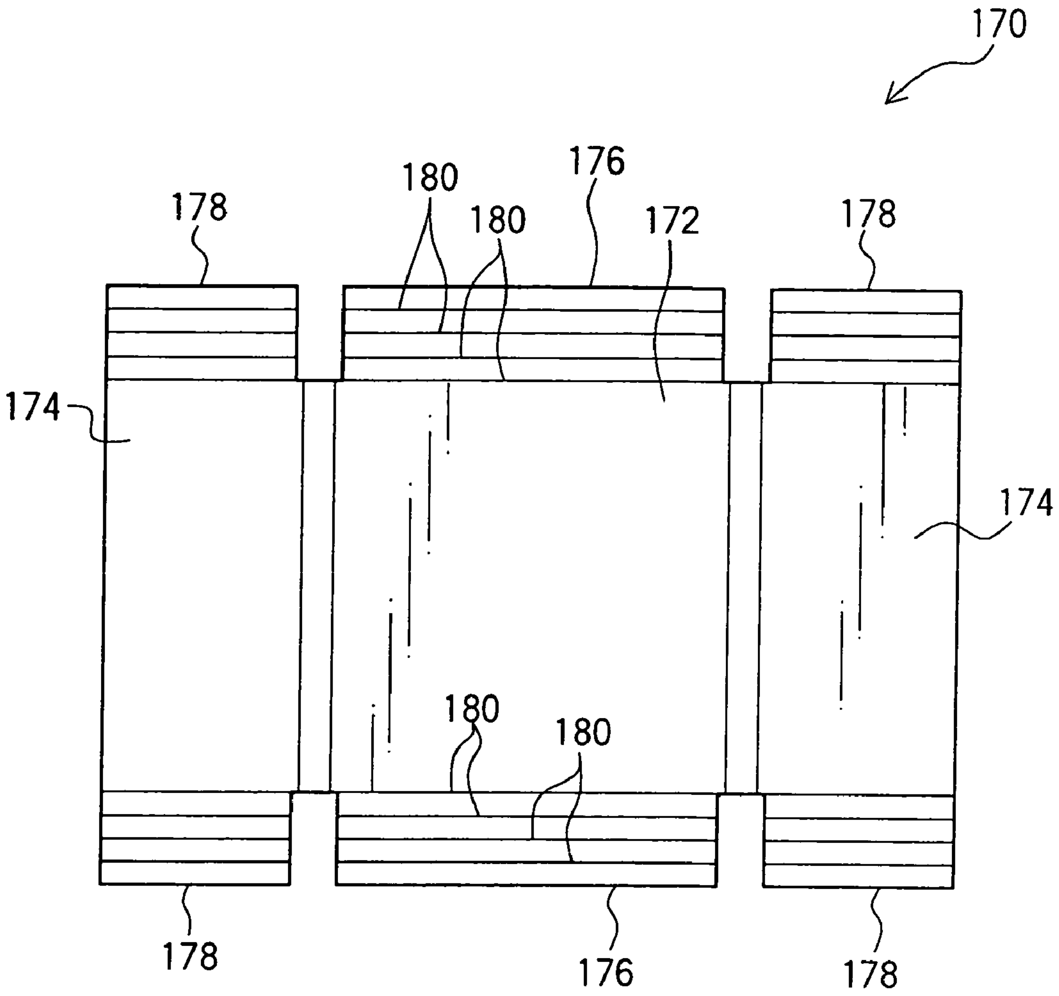
FIG. 2 is an unfolded view which illustrates a planographic printing plate packaging box relating to an embodiment of the present invention.

As understood from an unfolded view illustrated in FIG. 2, in a packaging box 170 for planographic printing plates, bottom surface stacking plates 176 are provided adjacent to short side of a bottom surface plate 172, and top surface stacking plates 178 are provided adjacent to short sides of top surface plates 174. A plurality of fold lines 180 are formed on the bottom surface stacking plates 176 and the top surface stacking plates 178. As illustrated in FIG. 1, by folding the bottom surface stacking plates 176 and the top surface stacking plates 178 at these fold lines 180, convoluted stacking portions 182, 184 are formed when the packaging box 170 is in an assembled state. Moreover, even when large force is externally exerted on the packaging box 170 for planographic printing plates, the planographic printing plates 10 which form the stack 12 can be reliably protected at least to such an extent that defects or deformation affecting the quality of the plates do not arise. Further, an output port (top surface) of the packaging box 170 for planographic printing plates is closed by the top face plates 174. As illustrated by arrows H in FIG. 1, by opening the top surface plates 174 outwards, the packaging box 170 for planographic printing plates is opened and the planographic printing plates 10 can be taken out from the output port. The cross-sectional view shown in FIG. 3 illustrates such a state that the top surface plates 174 are opened outwards.

Here, in the planographic printing plate packaging structure of the present embodiment, as illustrated in FIG. 3, the stack 12 is accommodated in the packaging box 170 in a manner such that the imaging surfaces 10P of the planographic printing plates 10 are directed to a side opposing the opening portion (the output port) of the packaging box 170 for planographic printing plates. Thus, when the packaging box 170 for planographic printing plates is opened outwards in a state in which the top surface plates 174 are on a top, the imaging surfaces 10P of the planographic printing plates 10 are directed downwards.

Depending on an apparatus (for example, an automatic plate making machine) in which the planographic printing plate 10 is used, the planographic printing plate 10 may be set in a state in which the imaging surface 10P of the planographic printing plate 10 is directed downwardly. As described above, in the planographic printing plate packaging structure of the present embodiment, the planographic printing plates 10 can be taken out from the packaging box 170 in a state in which the imaging surfaces 10P of the planographic printing plates 10 are directed downwards, when the planographic printing plate packaging box 170 is opened in a state in which the top surface plates 174 are on the top. Thus, a user of the planographic printing plate 10 can directly set the planographic printing plate 10 which has just been taken out from the packaging box 170 in an apparatus without turning it over so that an operational burden on the user can be reduced. Moreover, the planographic printing plate 10 is not deformed by receiving external force locally and the coating film thereof is not peeled off due to the reversing operation. A predetermined quality of the planographic printing plate 10, therefore, is maintained.

Figure 4:
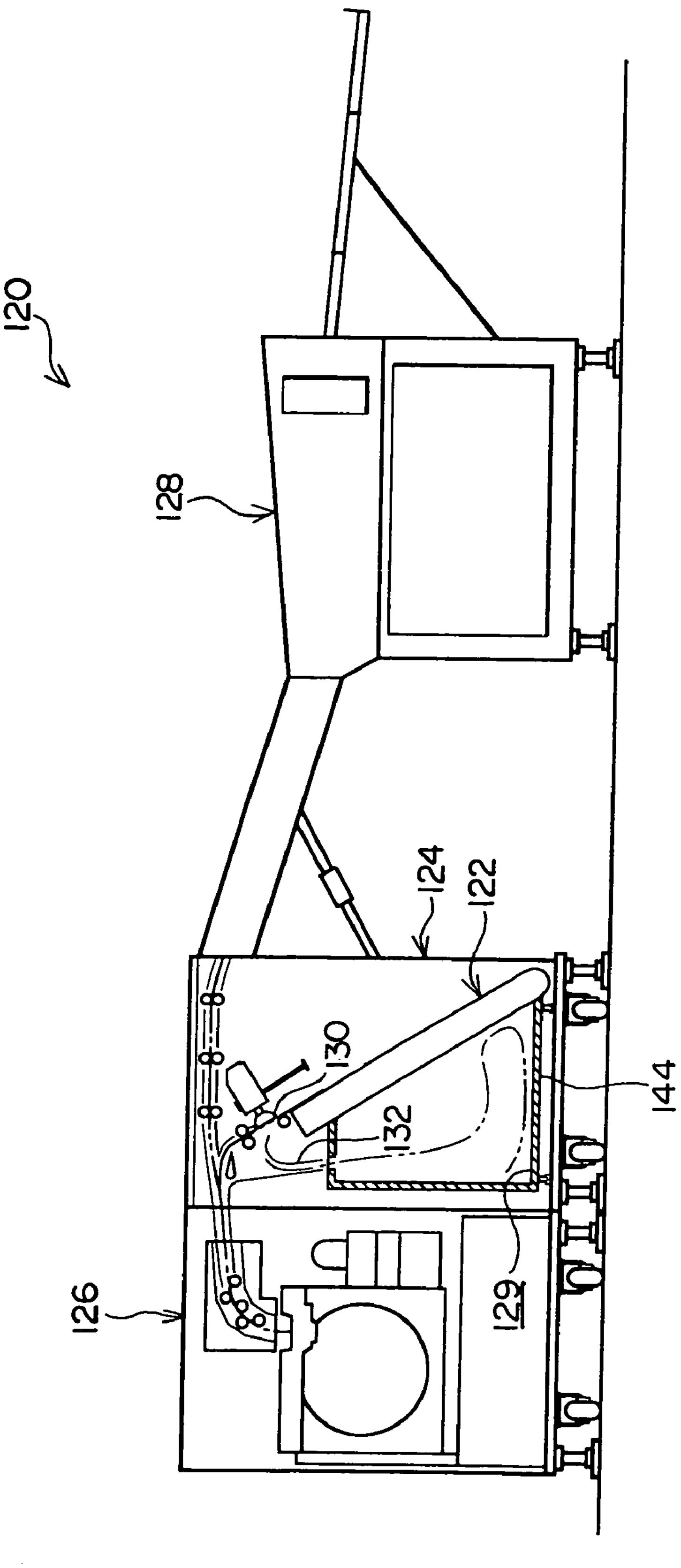
FIG. 4 is a front elevational view which illustrates a schematic structure of an automatic plate-making machine in which planographic printing plates packaged by the planographic printing plate packaging structure of the present invention are used.

In FIG. 4, an example of the automatic plate making machine using the planographic printing plate 10 is illustrated.

This automatic plate making machine 120 comprises a planographic printing plate feeder 122, a transporting device 124, an exposure device 126 and a development fixing device 128. The planographic printing plate feeder 122 is supported by a supporting mount 144 disposed within the transporting device 124. In the planographic printing plate feeder 122, the stack 12 is set in a manner such that the imaging surfaces 10P of the planographic printing plates 10 are directed so as to be inclined relatively downwards (opposing the supporting mount 144).

In the transporting device 124, a suction pad 130 is mounted movably in a transporting direction of the planographic printing plate 10 (arrow A direction) and such that it can adhere to and separate from the stack 12 of the planographic printing plates 10 loaded thereon. By means of this suction pad 130, the planographic printing plates 10 are taken out a piece at a time from the planographic printing plate feeder 122 and supplied to the exposure device 126.

Further, an unillustrated sensor is mounted in the planographic printing plate feeder 122 so as to determine whether an object sucked by the suction pad 130 is the planographic printing paper 10 or the interleaf sheet 14. On a basis of information from the sensor, the suction pad 130 feeds only the planographic printing plates 10 to the exposure device 126 and transports the interleaf sheets 14 to a paper discharging section 129 provided within the planographic printing plate feeder 122.

Further, in a transporting direction downstream side of the planographic printing plate 10, a friction guide 132 is mounted. In a case in which the interleaf sheet 14 is adhered to the planographic printing plate 10 which has been sucked by the suction pad 130, this friction guide 132 can abut the interleaf sheet 14 and peel the interleaf sheet 14 off from the planographic printing plate 10 due to friction, while the planographic printing plate 10 is being transported.

In the planographic printing plate feeder 122 of the automatic plate-making machine 120 having the above-described structure, the stack 12 is set such that the imaging surfaces 10P of the planographic printing plates 10 are directed so as to be inclined downwards. Therefore, even in a case in which the planographic printing plate packaging box 170, in which the stack 12 has been accommodated therein, is placed horizontally, there is no need to reverse the planographic printing plates 10 but only to raise the stack 12 at the time of setting. Or, in a state in which the planographic printing plate packaging box 170 itself stands diagonally, the stack 12 accommodated therein is set diagonally as well so that the stack 12 can be set in the transporting device 124 in situ (without making a large change in an angle of incline of the stack 12 or reversing the stack 12), and this facilitates the operation furthermore.

Figure 5:
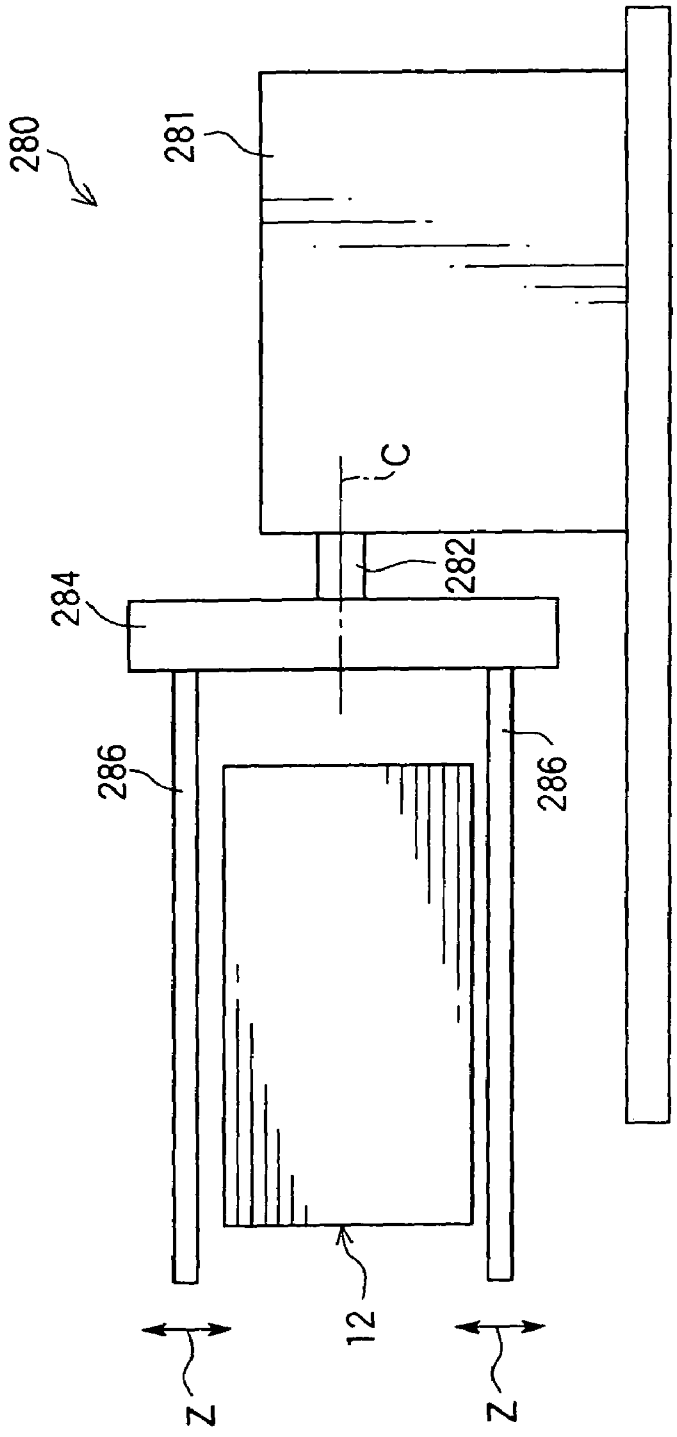
FIG. 5 is a side view which illustrates a schematic structure of a reversing device used for forming the planographic printing plate packaging structure of the present invention.

Generally, in a planographic printing plate processing line for processing (cutting or the like) an aluminum web on which a coating film has been applied, which aluminum web is for obtaining the planographic printing plates 10 with a predetermined size, the planographic printing plates 10 are often stacked in a manner such that the imaging surfaces 10P are directed upwards so as to form the stack 12. In this case, the stack 12 can be reversed using, for example, a reversing device 280 illustrated in FIG. 5.

In this reversing device 280, a shaft 282 which is rotatable around a center line C is provided at a main body 281, and a pair of gripping plates 286 are provided via a joint portion 284 at a distal end of the shaft 282. The pair of gripping plates 286 are formed in parallel and in plate form, and move toward and away from each other in arrow Z direction. Thus, the stack 12, which has been formed by stacking the planographic printing plates 10 in a manner such that the imaging surfaces 10P are directed upwards, is gripped from above and below with the pair of gripping plates 286, and the joint portion 284 and the pair of gripping plates 286 are rotated around the shaft 282. Accordingly, a plurality of planographic printing plates 10 can be reversed in a single integrated operation so as to have the imaging surfaces 10P thereof face downward. It is a matter of course that the planographic printing plates 10 may be reversed a piece at a time without using such a reversing device 280 and then stacked to form the stack 12.

Further, a packaging box for forming the planographic printing plate packaging structure of the present invention is not necessarily limited to the above-described packaging box 170 for planographic printing plates. Namely, a structure which can accommodate and package the stack 12 therein and includes a entrance provided therein, from which the planographic printing plates 10 which form the stack 12 accommodated in the structure can be taken out, is applicable. For example, a packaging box 30 for planographic printing plates with a structure shown in FIG. 6 may be used.

This packaging box 30 for planographic printing plates is formed by a packaging box main body 32, a base rug pad 34 disposed inside this packaging box main body 32, and a roof plate 36 which closes an opening portion of the packaging box main body 32.

Figure 8:
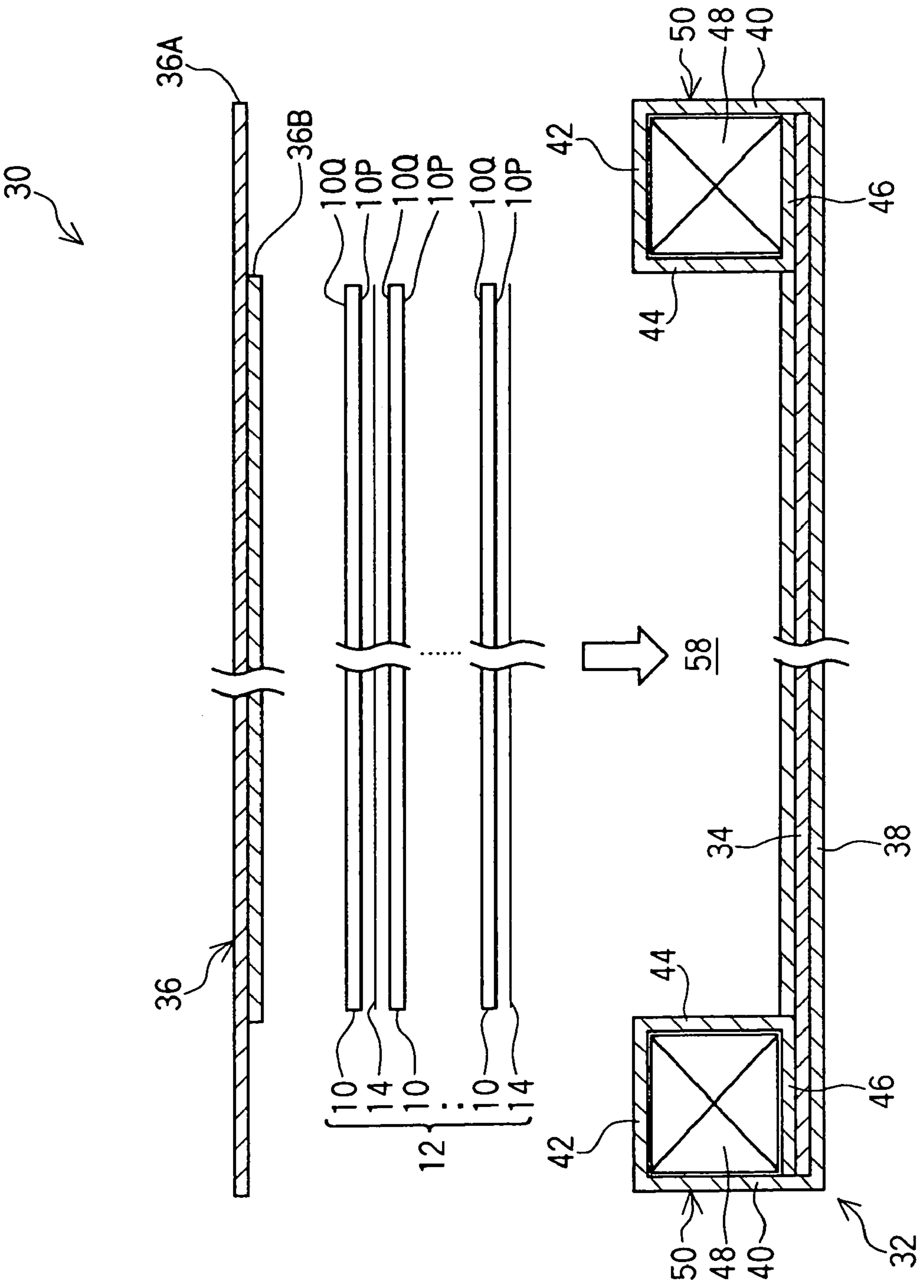
FIG. 8 is a sectional view which illustrates the planographic printing plate packaging structure shown in FIG. 6 in a state in which the planographic printing plates forming the stack are separated from each other.
Figure 9:
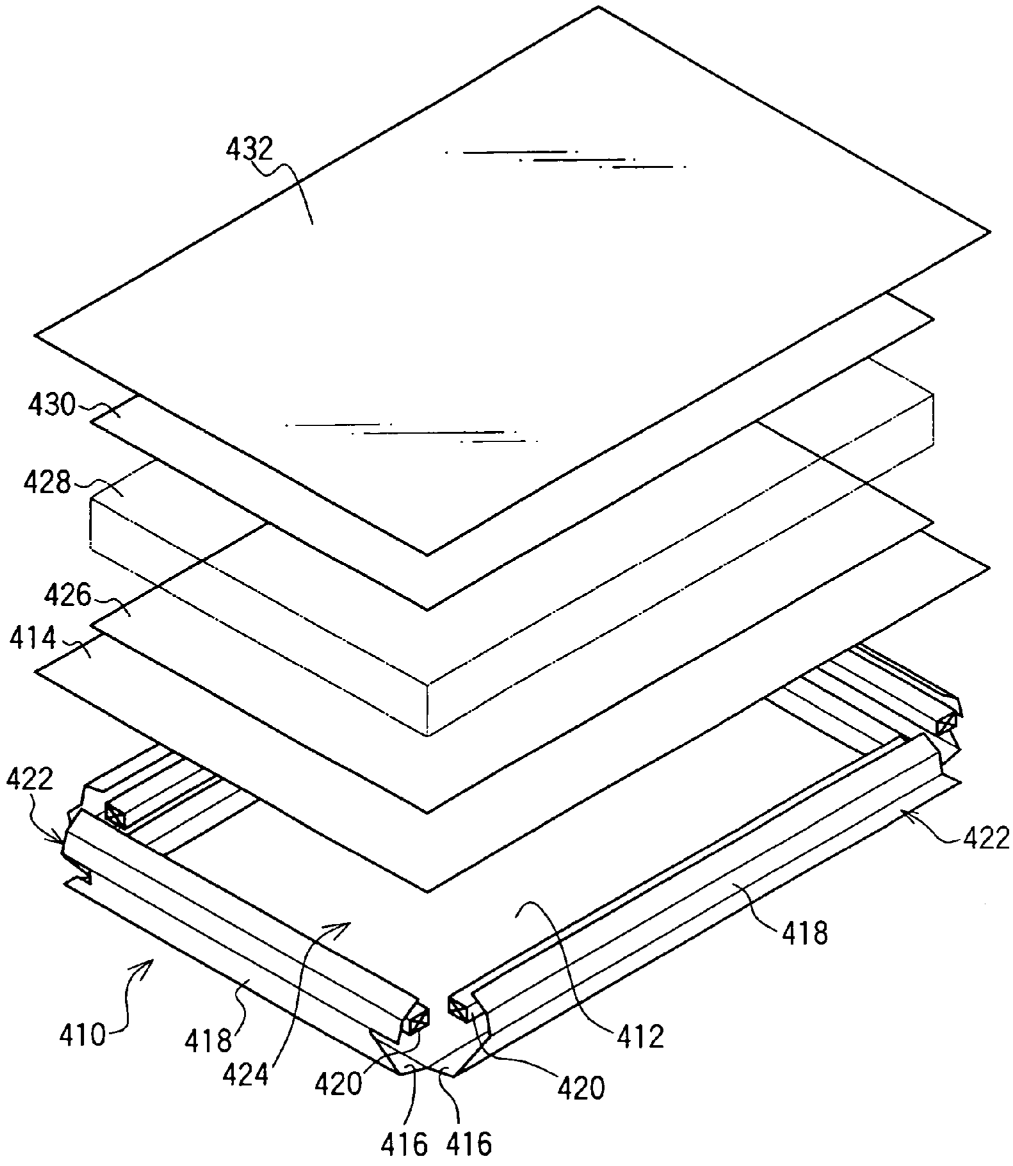
FIG. 9 is an exploded perspective view which illustrates a conventional planographic printing plate packaging structure.

As seen from FIG. 8, the roof plate 36 is formed by a roof plate main body 36A and roof back pad 36B being attached together. The size of the roof back pad 36B is the same as the size of a top surface of the stack 12. When the roof plate 36 closes the opening portion of the packaging box main body 32, the roof back pad 36B enters the accommodation space 58 which will be described later. Meanwhile, the size of the roof plate main body 36A is set such that a periphery thereof is equal to that of a periphery of a top surface of the assembled packaging box main body 32.

Figure 6:
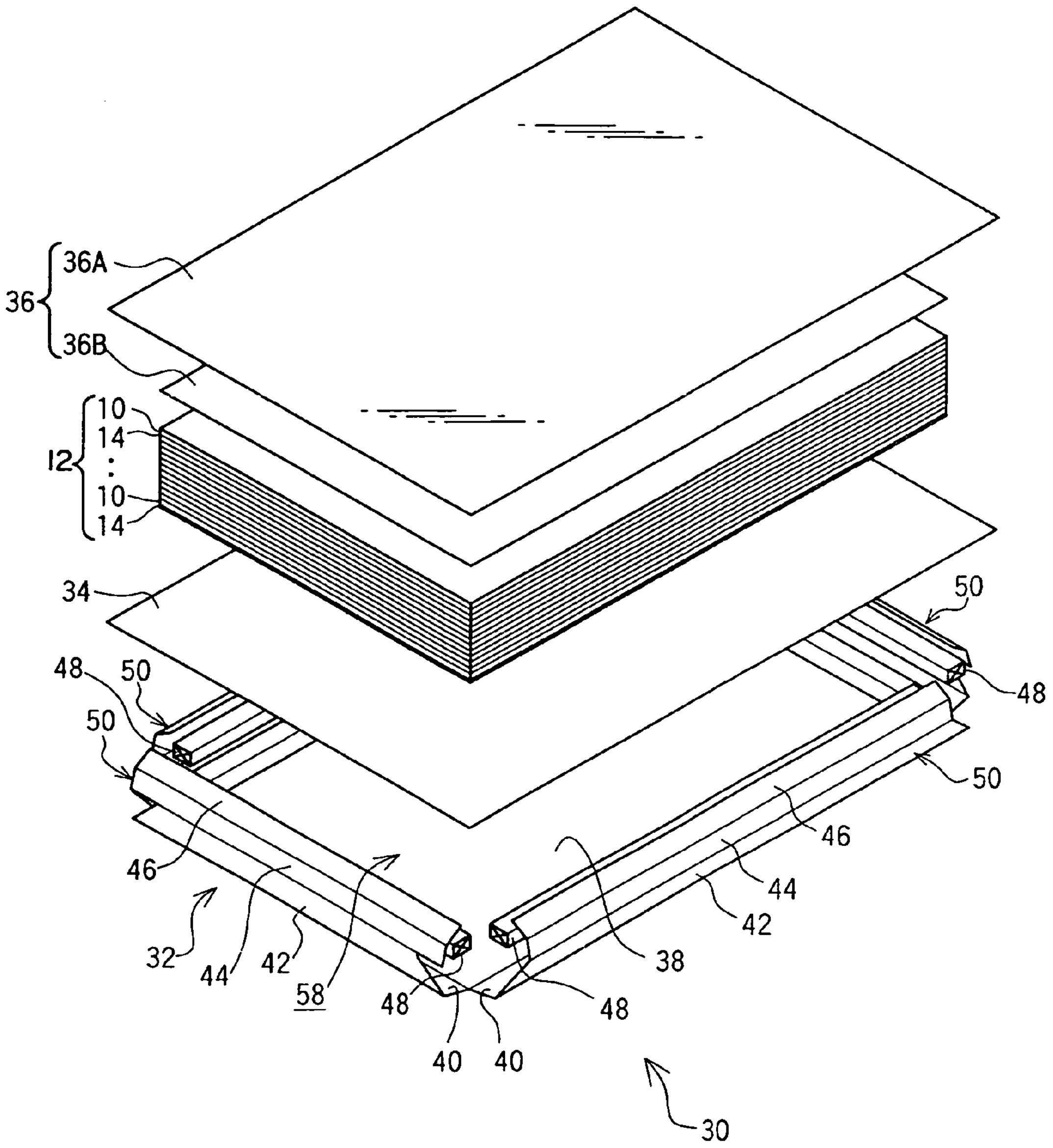
FIG. 6 is a perspective view which illustrates another example of a planographic printing plate packaging box relating to the planographic printing plate packaging structure of an embodiment of the present invention.
Figure 7:
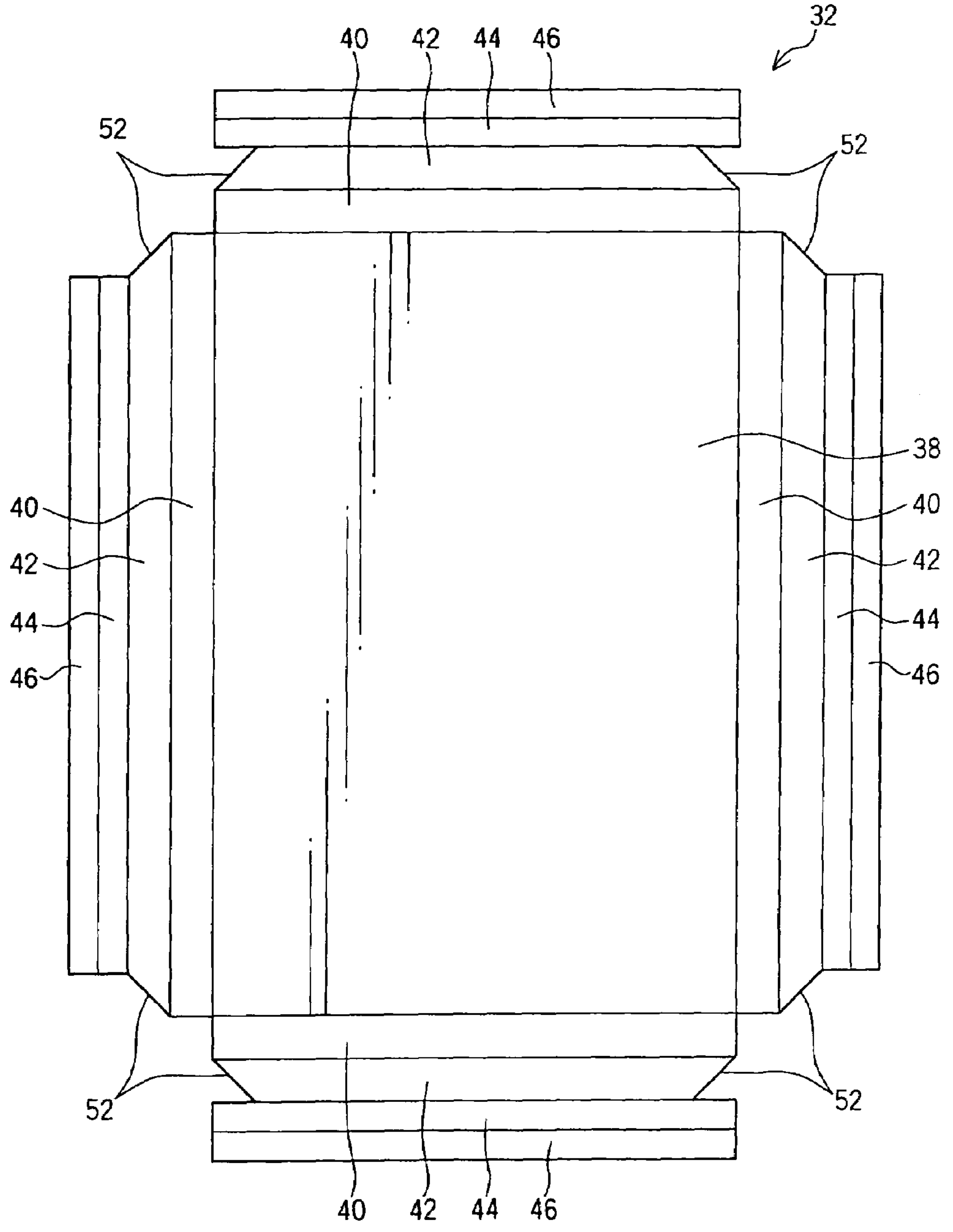
FIG. 7 is an unfolded view which illustrates a packaging box main body of the packaging box for planographic printing plates shown in FIG. 6.

The packaging box main body 32 has a bottom plate portion 38 which is formed larger than the planographic printing plates 10. As illustrated in FIG. 7, side plate portions 40, top plate portions 42 and inner plate portions 44, 46 are continuously formed in that order from respective edges of the bottom plate portion 38. As illustrated in FIG. 6 and FIG. 8, in a state in which the packaging box main body 32 has been assembled, while the side plate portions 40, top plate portions 42 and inner plate portions 44, 46 are folded in that order such that portions adjacent to each other are at right angles and rolled, core materials 48 are accommodated inside the rolled portions formed by the side plate portions 40, top plate portions 42 and inner plate portions 44, 46, respectively, and reinforcing portions 50 are thus formed. The packaging box 30 for planographic printing plates is reinforced by these reinforcing portions 50 so that the packaging box 30 is not bent and curved inadvertently.

Further, in a state in which the packaging box main body 32 has been assembled, a face opposing the bottom plate portion 38 is opened. This opening portion serves as a entrance which is for taking the stack 12 into the packaging box main body 32 or for taking the stack 12 out from the packaging box main body 32.

Longitudinal direction opposing edges of the top plate portions 42 are protrusion edges 52 which have been cut at 45 degrees such that the top plate portions 42 which are adjacent to each other do not overlap with each other (FIG. 7).

The stack 12 is accommodated in the planographic printing plate packaging box 30 with the above-described structure. In a state in which the stack 12 is accommodated, the opening portion of the packaging box main body 32 is closed by the roof plate 36, and the roof plate 36 is fixed to the packaging box main body 32 by fixing means. In this way, the stack 12 is packaged in the packaging box 30 for planographic printing plates, and the planographic printing plate packaging structure of the present embodiment is thereby formed. Further, the fixing means for fixing the roof plate 36 to the packaging box main body 32 is not particularly limited. For example, an adhesive member such as an adhesive tape and an adhesive can be used for the fixing means. In particular, if an adhesive tape is attached to the entire periphery of the roof plate 36, an inner side of the packaging box 30 for the planographic printing plates can be completely blocked from external light so that an inadvertent exposure of the planographic printing plates 10 can be prevented, and this is preferable.

In a case in which this packaging box 30 for planographic printing plates is used, as illustrated in FIG. 8, the planographic printing plate packaging structure of the present invention can be formed by accommodating and packaging the planographic printing plates 10 (stack 12) in the packaging box 30 in a manner such that the imaging surfaces 10P of the planographic printing plates 10 face the base plate portion 38, as well.

Materials which form the packaging boxes (the above-described packaging box 30, 170 and the like for planographic printing plates) of the present invention are not particularly limited. For example, by making the packaging boxes out of corrugated cardboard, packaging boxes with light-weights can be manufactured at low costs and predetermined strengths and rigidities can be easily obtained. Other than the corrugated cardboard, for example, cardboard, kraft paper, a honeycomb structured material made of paper or the like can be used as well.

When the corrugated cardboard is used as the material forming the packaging boxes, from the viewpoints of strength and rigidity, it is preferable that the following conditions are satisfied.

First, the most preferable type of corrugation (flute) for the corrugated cardboard is an A flute, followed by a C flute, a B flute and an E flute in that order. The most preferable type of layer structure for the corrugated cardboard is triple wall corrugate cardboard (such as AAA), followed by double wall corrugated cardboard (such as AA) and single wall corrugated cardboard (such as A). The most preferable type of liner for front and rear liners of the corrugated cardboard is an AA liner, followed by an A liner, a B liner and a C liner. The basis weight of the front and rear liners is in a range of 160 to 440 $g/m^2$. The most preferable type of corrugating medium for the corrugated cardboard is reinforced corrugating medium, followed by an A corrugating medium, a B corrugating medium and a C corrugating medium. The basis weight of the corrugating medium is in a range of 100 to 280 $g/m^2$.

When the paper-made honeycomb structured material is used in place of the corrugated cardboard, the same front liner, rear liner and corrugating medium as those of the above-described corrugated cardboard are preferably used.

Further, when the cardboard is used in place of the corrugated cardboard, the basis weight thereof is preferably in a range of 200 to 2,000 $g/m^2$. (It should be noted that higher the values of the basis weights of the front liner, the rear liner, the corrugating medium, and the cardboard forming the corrugated cardboard and the honeycomb structure material, the greater the strength of the packaging boxes.)

Also, the formation of the planographic printing plates 10 which are accommodated and packaged in the packaging boxes 30, 170 for planographic printing plates is not limited to those described above. For example, a single planographic printing plate 10 may be accommodated and packaged in a packaging box (without forming the stack 12).

What is claimed is:

1. A planographic printing plate packaging product comprising:

a stack of planographic printing plates that each includes one surface as an imaging surface; and a packaging box that accommodates the stack of planographic printing plates, the packaging box including an entrance for manually taking out the printing plates accommodated therein; and a plurality of sheets of cardboard at intervals of the printing plates for protecting the printing plates from damage or deformation due to an external force acting on the packaging box;

wherein the planographic printing plates are accommodated and packaged in the packaging box in a manner such that the imaging surfaces of the planographic printing plates are directed to a side opposing the entrance, and at least one of the imaging surfaces include a recording layer having a solubility that changes with respect to a developer when the recording layer is irradiated with a laser beam; and wherein the imaging surface of each planographic printing plate is completely covered with an interleaf sheet.

2. The planographic printing plate packaging product according to claim 1, wherein the packaging box comprises a pair of top face plates and a bottom face plate, a plurality of fold lines are formed on wing portions provided respectively on opposing sides of the top face plates and the bottom face plate, and the entrance is assembled in a door form by folding the plurality of fold lines of the top face plates.

3. The planographic printing plate packaging product according to claim 2, wherein the imaging surfaces of the planographic printing plates each include a recording layer comprising a solubility that changes with respect to a developer when the recording layer is irradiated with a laser beam.

4. The planographic printing plate packaging product according to claim 1, wherein the packaging box comprises a main body, a roof portion, and a bottom plate, the main body including side portions which extend from respective edges of the bottom plate, the side portions including several folds forming sections covering side portions of the planographic printing plates.

5. The planographic printing plate packaging product according to claim 4, further comprising cores accommodated in the sections covering the side portions of the planographic printing plates, which form reinforcing portions.

6. The planographic printing plate packaging product according to claim 5, wherein the imaging surfaces of the planographic printing plates each include a recording layer comprising a solubility that changes with respect to a developer when the recording layer is irradiated with a laser bean.

7. The planographic printing plate packaging product according to claim 4, wherein the imaging surfaces of the planographic printing plates each include a recording layer comprising a solubility that changes with respect to a developer when the recording layer is irradiated with a laser beam.

8. The planographic printing plate packaging product of claim 1, wherein the recording layer contains an infrared ray absorbent, a compound which generates an acid when heated, and a compound which is cross-linked by acids.

9. The planographic printing plate packaging product of claim 1, wherein the recording layer contains an infrared ray absorbent, and a compound which becomes soluble in an alkali when heated.

10. The planographic printing plate packaging product of claim 1, wherein the recording layer comprises a layer containing a compound which generates a radical when irradiated with a laser beam, a binder which is soluble in an alkali, and a polyfunctional monomer or prepolymer; and an oxygen-blocking layer.

11. The planographic printing plate packaging product of claim 1, wherein the recording layer comprises a physical development nucleus layer and a silver halide emulsion layer.

12. The planographic printing plate packaging product of claim 1, wherein the recording layer comprises a polymer layer containing a polyfunctional monomer and a multifunctional binder, a layer containing silver halide and a reducing agent, and an oxygen-blocking layer.

13. A method for packaging planographic printing plates comprising the steps of:

(a) providing a packaging box including an entrance for manually removing the planographic printing plates accommodated therein;

(b) accommodating and packaging the planographic printing plates that each include one surface as an imaging surface in the packaging box with the planographic printing plates accommodated and packaged in the packaging box such that the imaging surface of each of the planographic printing plates is directed away from the entrance, wherein the imaging surface includes a recording layer having a solubility that changes with respect to a developer when the recording layer is irradiated with a laser beam; and wherein the step of accommodating further comprises, for each planographic printing plate, accommodating art interleaf sheet that completely covers the imaging surface of each of the planographic printing plates, and accommodating a plurality of sheets of cardboard at intervals of the printing plates for protecting the printing plates from damage or deformation due to an external force acting on the packaging box.

14. The method for packaging planographic priming plates according to claim 13, further comprising the step of assembling a plate which comprises a pair of top face plates each including wing portions on opposing sides thereof and comprising fold lines in the wing portions, and a bottom face plate to form the packaging box by folding the plurality of fold lines to form the entrance in a door included with the entrance.

15. The method for packaging planographic printing plates according to claim 13, further comprising the steps of:

(c) assembling a main body, which includes folding side portions of the main body several times to form sections for covering side portions of the planographic printing plates; and (d) mounting a roof portion to the main body.

16. The method for packaging planographic printing plates according to claim 15, further comprising the step of accommodating cores in the sections for covering the side portions of the planographic printing plates.

17. The method of claim 13, wherein the recording layer contains an infrared ray absorbent, a compound which generates an acid when heated, and a compound which is cross-linked by acids.

18. The method of claim 13, wherein the recording layer contains an infrared ray absorbent, and a compound which becomes soluble in an alkali when heated.

19. The method of claim 13, wherein the recording layer comprises a layer containing a compound which generates a radical when irradiated with a laser beam, a binder which is soluble in an alkali, and a polyfunctional monomer or prepolymer; and an oxygen-blocking layer.

20. The method of claim 13, wherein the recording layer comprises a physical development nucleus layer and a silver halide emulsion layer.

21. The method of claim 13, wherein the recording layer comprises a polymer layer containing a polyfunctional monomer and a multifunctional binder, a layer containing silver halide and a reducing agent, and an oxygen-blocking layer.

* * * * *